United States Patent [19]
Yoon et al.

[11] Patent Number: 6,008,097
[45] Date of Patent: Dec. 28, 1999

[54] MOS TRANSISTOR OF SEMICONDUCTOR DEVICE AND METHOD OF MANUFACTURING THE SAME

[75] Inventors: Yong Sun Yoon; Kyu Ha Baek; Kee Soo Nam, all of Daejon-Shi, Rep. of Korea

[73] Assignee: Electronics and Telecommunications Research Institute, Daejon-Shi, Rep. of Korea

[21] Appl. No.: 08/989,033

[22] Filed: Dec. 11, 1997

[30] Foreign Application Priority Data

Dec. 14, 1996 [KR] Rep. of Korea ............ 96-65746

[51] Int. Cl.⁶ ........................... H01L 21/336
[52] U.S. Cl. ........................... 438/303; 438/301
[58] Field of Search ................ 438/396, 303, 438/234, 301; 257/327

[56] References Cited

U.S. PATENT DOCUMENTS

| | | | |
|---|---|---|---|
| 4,791,070 | 12/1988 | Hirao et al. | 437/2 |
| 5,275,960 | 1/1994 | Yamaguchi et al. | 437/41 |
| 5,486,488 | 1/1996 | Kamiyama | 437/60 |
| 5,705,420 | 1/1998 | Ema | 437/52 |
| 5,904,516 | 5/1999 | Park | 438/197 |

OTHER PUBLICATIONS

Kimura, S., et al., Short–Channel–Effect–Suppressed Sub–0.1–μm Grooved–Gate MOSFET's with W Gate., Jan. 1995, pp. 94–100.

Kinmura, S. et al., Short–Channel–Effect–Suppressed sub–0.1 –micrometer Grooved–Gate MOSFET's with W Gate., pp. 94–100, Jan. 1995.

*Primary Examiner*—John F. Niebling
*Assistant Examiner*—Walter L. Lindsay, Jr.
*Attorney, Agent, or Firm*—Cohen, Pontani, Lieberman & Pavane

[57] ABSTRACT

The present invention relates to a MOS transistor of semiconductor device and method of manufacturing the same and, in particular, to MOS a transistor of semiconductor device and method of manufacturing the same which can reduce asymmetry of drain current due to bias of drain current, facilitate shallow junction and reduce the area to a minimum by forming a source/drain.

2 Claims, 3 Drawing Sheets

MOS TRANSISTOR OF SEMICONDUCTOR DEVICE AND METHOD OF MANUFACTURING THE SAME

BACKGROUND OF THE INVENTION

1. Field of the Invention

The present invention relates to a MOS Trnsistor of semiconductor device and method of manufacturing the same and, in particular, to a MOS transistor of semiconductor device and method of manufacturing the same which can reduce asymmetry of drain current due to bias, facilitate shallow junction and reduce the area to a minimum by forming a source/drain in self-alignment method and diffusion method.

2. Disclosure Statement

In general, a MOS transistor consists of a gate, source and drain. A manufacturing process of the transistor is described below with reference to FIG. 1.

An active region and field region are defined by forming a field oxide film 2 in a semiconductor substrate 1 through a device separation mask process. A gate electrode 8 is formed on the semiconductor substrate 1 in the active region, and a gate oxide film 7 is formed between the semiconductor substrate 1 and gate electrode 8. A source/drain 4 of LDD structure formed by performing an ion implantation process in duplicate and spacer oxide films 6 are formed on both sides of the gate electrode 8 to complete the transistor. An interlayer insulation film 3 is formed on the semiconductor substrate 1 including the transistor for electric insulation between devices and protection of devices, and a metal electrode 5 which is connected to the source/drain 4 is formed through a metal contact process.

In case of NMOS device, a p-well is formed in the semiconductor substrate 1 through p-type impurity implantation process, and in case of PMOS device, a n-well is formed in the semiconductor substrate 1 through n-type impurity implantation process. The gate electrode 8 is formed with polycrystal silicon and the interlayer insulation film 3 is formed with BPSG which has superior flow characteristics. The source/drain 4 are formed through an ion implantation process and heat treatment process after formation of the field oxide film 2 and gate electrode 8.

As described above, since the source/drain are formed by heat treatment after ion implantation in the conventional device technology, an angle of ion implantation at the time of ion implantation and the bias of the source/drain 4 at the time of operation of device vary to inevitably cause asymmetry to degrade the performance of device. This phenomenon becomes further profound as the device is highly integrated. Furthermore, as the device is highly integrated, the junvyion depth of source/drain 4 must be decreased to the same ratio, however, it is very difficult to achieve that in the conventional device technology. In particular, in manufacturing PMOS device, the source/drain 4 junction is mainly obtained through heat treatment after implantation of Borous(B) ion, however, it is very difficult to from the shallow junction since the diffusion coefficient of Boron(B) is large. Therefore, various methods are used to achieve that, the typical one among them is to use rapid theamal annealing (RTA) method to form the shallow junction after ion implantation into the source/drain 4 according to a conventional method. However, this method has various problems in manufacturing an integrated circuit due to poor uniformity of process and leakage current.

SUMMARY OF THE INVENTION

Therefore, an object of the invention is to provide a transistor of semiconductor device and method of manufacturing the same which can increase the reliability of device and realize the high integration of the device by securing the superior uniformity of process, facilitating the shallow junction and reducing the area to a minimum by forming a source/drain in a self-alignment method and diffusion method.

A transistor of semiconductor device according to the present invention to accomplish the above described object is characterized in that it is constructed by defining an active region and field region by forming a field oxide film on a semiconductor substrate through a device separation mask process, forming a gate electrode on said semiconductor substrate in the active region, forming a gate oxide film between the semiconductor substrate and the gate electrode, forming a source/drain local electrode electrically insulated by a spacer insulation film on both sides of said gate electrode, forming on said semiconductor substrate below said local electrode a source/drain electrically contacting said local electrode, forming a source/drain connection layer between said local electrode and a metal electrode so that said source/drain is electrically connected to said metal electrode, forming an insulation film between said connection layer and semiconductor substrate, and forming an underlayer insulation film for electrical insulation between devices and protection of devices.

In addition, a method of manufacturing a transistor of semiconductor device according to the present invention comprises the steps of: sequentially forming a first insulation film, first silicon film and second insulation film on a semiconductor substrate including a field oxide film; forming a self-aligned source/drain region by sequentially etching a portion of said second insulation film, first silicon film and first insulation film so that said patterned first silicon film becomes a source/drain connection layer; sequentially forming a second silicon film and third insulation film on the entire structure including said source/drain region; forming a spacer oxide film and source/drain local electrode by sequentially etching said third insulation film and second silicon film; forming a gate oxide film through a thermal oxidation process, depositing a doped polycrystal silicon on the entire structure, and forming a gate electrode by planarization of said doped polycrystal silicon by polishing said doped polycrystal silicon with a chemical mechanical polishing(CMP) method, a source/drain being formed at the same time; and forming an underlayer insulation film on the entire structure in which said gate electrode is formed, and forming a metal electrode contacting said source/drain connection layer connected to said source/drain through a metal contact process.

BRIEF DESCRIPTION OF THE DRAWINGS

For fuller understanding of the nature and object of the invention, reference should be had to the following detailed description taken in conjunction with the accompanying drawings in which.

The above object, and other feature and advantages of the present invention will become more apparent by describing the preferred embodiment thereof with reference to the accompanying drawings, in which.

DETAILED DESCRIPTION OF THE INVENTION

The present invention will be described below in detail with reference to the accompanying drawing.

Figure 1:
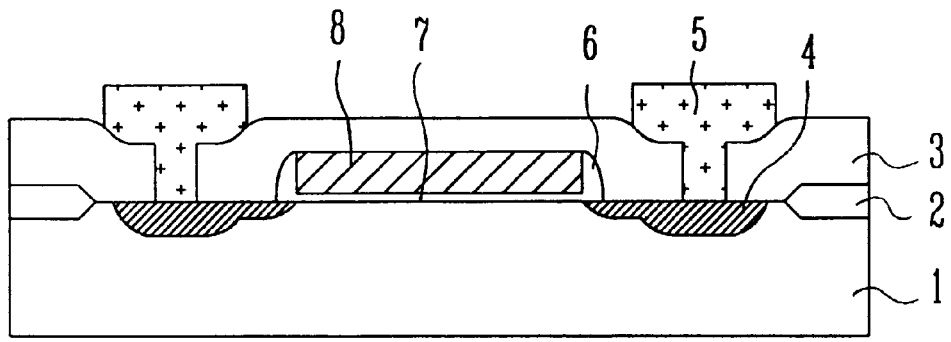
FIG. 1 is a sectional view of the structure of a MOS transistor manufactured according to a conventional technology.
Figure 2:
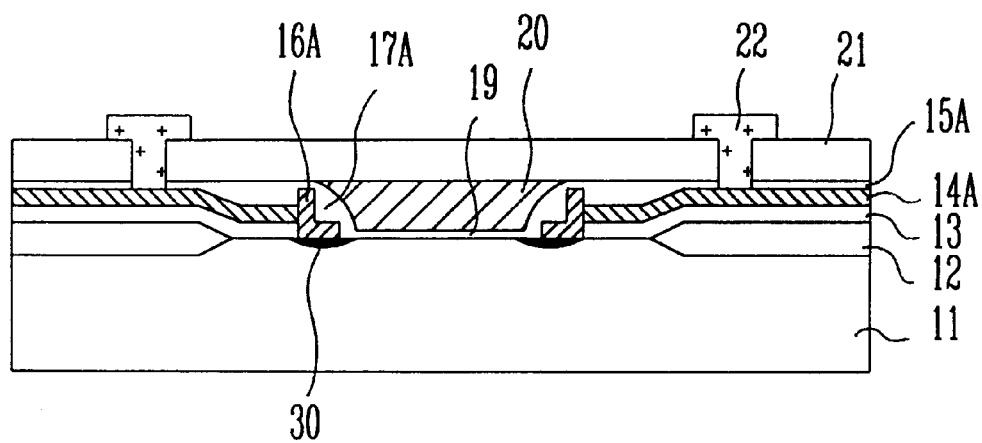
FIG. 2 is a sectional view of the structure of a MOS transistor according to an embodiment of the present invention and FIG. 3A to 3G are sectional views to show the process for manufacturing the transistor shown in FIG. 2

FIG. 2 is a sectional view of the structure of transistor according to an embodiment of the present invention.

An active region and field region are defined in a semiconductor substrate 11 by forming a field oxide film 12 through the device separation mask process. A gate electrode 20 is formed on the semiconductor substrate 11 in the active region, and a gate oxide film 19 is formed between the semiconductor substrate 11 and the gate electrode 20. Source/drain local electrodes 16A which are electrically insulated by a spacer insulation film 17A are formed on both sides of the gate electrode 20. A source/drain 30 which electrically contacts the local electrodes 16A is formed in the semiconductor substrate 11 below the local electrodes 16A. A source/drain connection layer 14A is formed between the local electrode 16A and metal electrode 22 so that the source/drain 30 is electrically connected to the metal electrode 22. An insulating film 13 is formed between a layer 14A and the semiconductor substrate 11. An underlayer insulation film 21 is formed for the electric insulation between devices and protection of device.

The transistor manufacturing process of the present invention is described below with reference to FIGS. 3A to 3G.

Figure 3A:
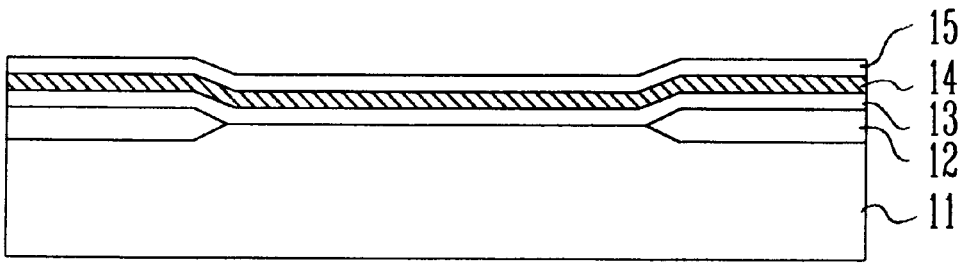

Referring to FIG. 3A, the active region and field region are defined by forming the field oxide film 12 in the semiconductor substrate 11 through the device separation mask process. The first insulation film 13, first silicon film 14 and second insulation film 15 are sequentially formed on the semiconductor substrate 11 including the field oxide film 12.

In case of NMOS device, the p-well is formed in the semiconductor substrate 11 through the p-type impurity implantation process, and in case of PMOS device, the n-well is formed in the semiconductor substrate 11 through the n-type impurity implantation process. The first insulation film 13 is formed by depositing an oxide film to separate the source/drain from the substrate. The first silicon film 14 is formed by depositing a doped polycrystal silicon or doped amorphous silicon. The first silicon film 14 is formed by implanting Phosphorous(P) ion in case of NMOS device and Borous(B) ion in case of PMOS device. The second insulation film 15 is formed by depositing the oxide film.

Figure 3B:
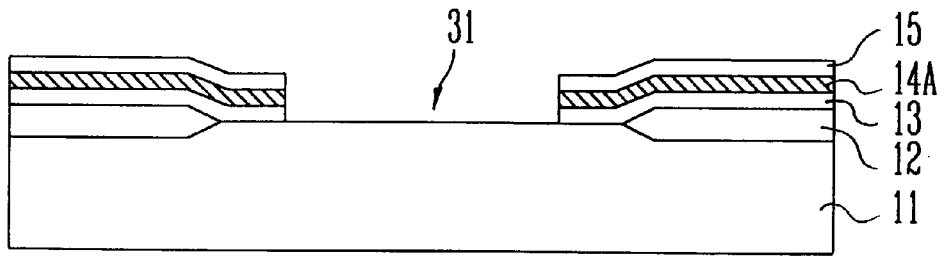

FIG. 3B shows a condition in which a source/drain region 31 is formed which is self-aligned by sequentially etching the second insulation film 15, first silicon film 14 and first insulation film 13 through an anisotropic etching process using a source/drain mask.

In the above condition, the first silicon film 14 which is patterned become the source/drain connection layer 14A.

Figure 3C:
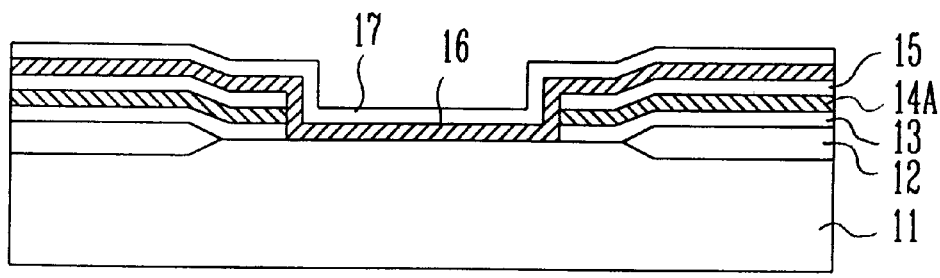

FIG. 3C capital C shows a condition in which the second silicon film 16 and third insulation film 17 are sequentially formed on the entire structure including the source/drain region 31.

The second silicon film 16 is formed by depositing the polycrystal silicon or amorphous silicon, and the third insulation film 17 is formed by depositing an oxide.

Figure 3D:
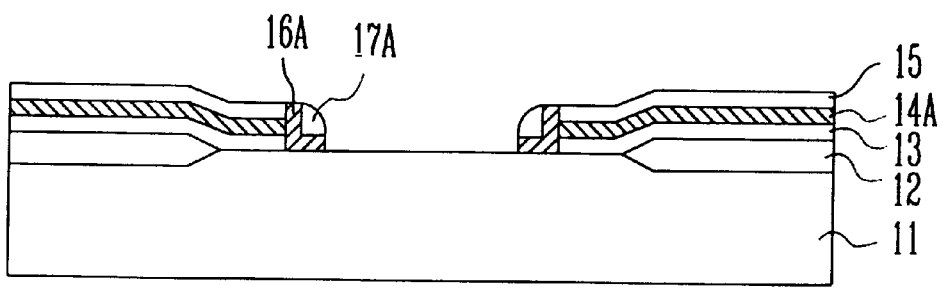

FIG. 3D shows a condition in which the source/drain local electrode 16A and the spacer oxide film 17A are formed by sequentially etching the third insulation film 17 and second silicon film 16.

Figure 3E:
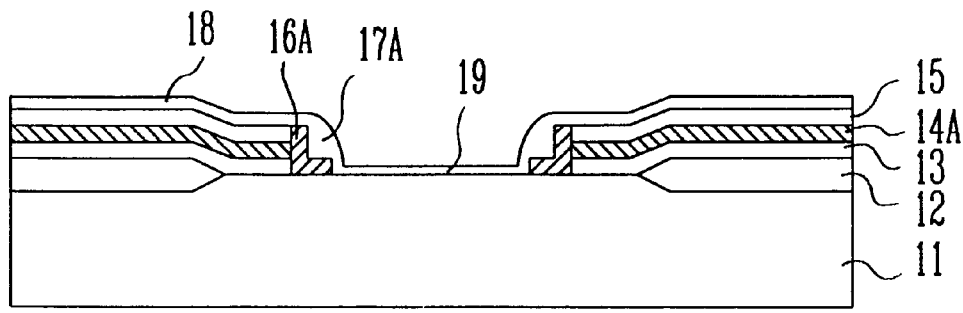
Figure 3F:
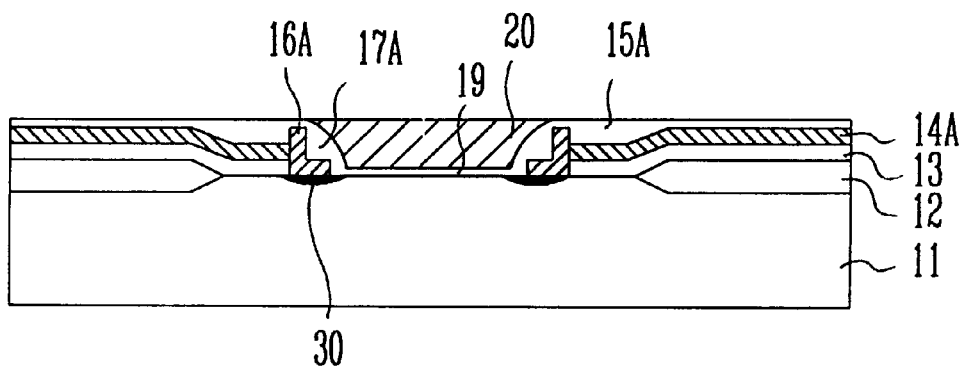

FIG. 3E shows a condition in which the thermal oxide film 18 and gate oxide film are formed through thermal oxidation process, and FIG. 3F shows a condition in which the gate electrode 20 is formed on the gate oxide film 19 by depositing a doped polycrystal silicon on the entire structure in which the gate oxide film 19 is formed and thereafter planarization of the polycrystal silicon by polishing it with chemical mechanical polishing method, and here the source/drain 30 is shown as completed.

In the process described above, an impurity contained in the source/drain connection layer 14A is diffused into the semiconductor substrate 11 using a source/drain local electrode 16A as a diffusion path during the thermal oxidation process for forming the gate oxide film 19, and the diffused impurity is activated during the doped polycrystal silicon deposition process for forming the gate electrode 20, thereby forming the source/drain 30. The junction depth and area of the source/drain 30 are decided by the area and thickness of the local electrode 16A which is the diffusion path. Therefore, the problem in the conventional technology that the formation of shallow junction in the source/drain of PMOS device is difficult can be easily solved. In case of NMOS, the shallow junction can be formed in the same way. In addition, planarization with CMP method to form the gate electrode 20 facilitates a subsequent process. That is, although the planzarization is achieved to some degree using the flow of oxide film using a material such as BPSG at the time of formation of metal electrode in the conventional technology, since the planarization according to the present invention is achieved across the entire wafer, subsequent metal wiring processes can be further easily proceeded. In addition, the present invention has an advantage in that the BPSG material which is generally used in the conventional technology does not have to be used. Since the BPSG used as the flattening film is hydrophilic material, it has various problems in long term reliability.

Figure 3G:
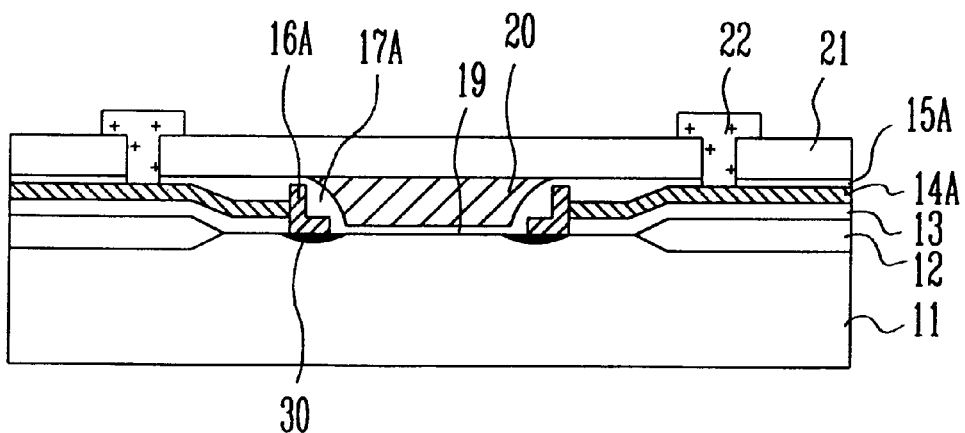

FIG. 3G shows a condition in which the interlayer insulation film 21 is formed on the entire structure after the gate electrode 20 is formed, and the metal electrode 22 which contacts the source/drain connection layer 14A connected to the source drain 30 is formed through the metal contact process.

In the above process, the BPSG material which has superior planarization characteristics is mainly used for the interlayer insulation film 21 in the conventional technology, however, in the present invention, since the surface planarization is already achieved prior to the interlayer insulation film formation process, other oxide may be sued as well.

According to the embodiment of the present invention, not only the individual PMOS device and NMOS device can be alternatively used but also the sequence of the source/drain formation process and the gate formation process can be changed in CMOS manufacturing method so that the self-aligned source/drain can be formed to thereby obtain a stable shape, and also the shallow junction of source/drain can be easily and uniformly obtained since the diffusion coefficients of Phosphorus(P) and Boron(B) used as source/drain impurity in CMOS device are almost similar to each other by using the polycrystal silicon as the diffusion source of source/drain, and still further, since the shapes of the source/drain of NMOS and PMOS can be almost identically formed, the reliability of device can be improved. Furthermore, since the chemical mechanical polished planarization is obtained after coating of gate polycrystal silicon, the stability of subsequent processed is obtained.

The present invention as described above has advantages in that the shallow junction of the source/drain which is one of problems in conventional technology can be stably obtained and also easy approach to application and to manufacturing the highly integrated device to be developed in the future is provided. Since the area of source/drain is significantly reduced, the device of the present invention is further improved in the operation speed than conventional device. The fact that the length of gate can be directly adjusted using the local interconnection polycrystal silicon in the self-aligned source/drain has an advantage of further increasing the possibility of application of the device of present invention to device. In addition, planarization the gate polycrystal silicon has an advance of further facilitating an anticipated super-multilayer metal wiring in device.

What is claimed is:

1. A method of manufacturing a transistor of semiconductor device, comprising the steps of:

forming two regions of a field oxide film on a semiconductor substrate;

sequentially forming a first insulation film, first silicon film and second insulation film on said semiconductor substrate and said two regions of said field oxide film, said first and second insulation film being formed by depositing an oxide;

forming a self-aligned source/drain region by sequentially etching a portion of said second insulation film, first silicon film and first insulation film between said two regions so that said remaining first silicon film becomes a pair of source/drain connection layers;

sequentially forming a second silicon film and third insulation film on the entire structure including said source/drain region, said third insulation film being formed by depositing an oxide;

forming a spacer oxide film and source/drain local electrode within said source/drain region at each pair o said pair of source/drain connection layers by sequentially etching said third insulation film and second silicon film;

forming a gate oxide film on the entire structure through a thermal oxidation process, depositing a doped polycrystal silicon on the gate oxide film, and forming a gate electrode by planarization of said doped polycrystal silicon by polishing said doped polycrystal silicon with a chemical mechanical polishing method, a source/drain being formed below each said source/drain local electrode during said thermal oxidation process; and forming an interlayer insulation film on the entire structure in which said gate electrode is formed, and forming a metal electrode contacting said source/drain connection layer connected to said source/drain through a metal contact process.

2. A method of manufacturing a transistor of semiconductor device, comprising the steps of:

forming two regions of a field oxide film on a semiconductor substrate;

sequentially forming a first insulation film, first silicon film and second insulation film on said semiconductor substrate and said two regions of said field oxide film;

forming a self-aligned source/drain region by sequentially etching a portion of said second insulation film, first silicon film and first insulation film between said two regions so that said remaining first silicon film becomes a pair of source/drain connection layers;

sequentially forming a second silicon film and third insulation film on the entire structure including said source/drain region;

forming a spacer oxide film and source/drain local electrode within said source/drain region at each pair of said pair of source/drain connection layers by sequentially etching said third insulation film and second silicon film;

forming a gate oxide film on the entire structure through a thermal oxidation process, depositing a doped polycrystal silicon on the gate oxide film, and forming a gate electrode by planarization of said doped polycrystal silicon by polishing said doped polycrystal silicon with a chemical mechanical polishing method, a source/drain being formed below each said source/drain local electrode during said thermal oxidation process; and forming an interlayer insulation film on the entire structure in which said gate electrode is formed, and forming a metal electrode contacting said source/drain connection layer connected to said source/drain through a metal contact process, wherein said step of forming a gate oxide film further comprises forming said source/drain when an impurity contained in said source/drain connection layer is diffused into said semiconductor substrate using the source/drain local electrode as a diffusion path during the thermal oxidation process for forming said gate oxide film and activating said diffused impurity during said depositing a doped polycrystal silicon on the gate oxide film for forming said gate electrode.

* * * * *